(12) United States Patent  
Koh et al.

(10) Patent No.: US 7,582,899 B2
(45) Date of Patent: Sep. 1, 2009

(54) SEMICONDUCTOR DEVICE HAVING OVERLAY MEASUREMENT MARK AND METHOD OF FABRICATING THE SAME

(75) Inventors: Cha-Won Koh, Yongin-si (KR); Sang-Gyun Woo, Yongin-si (KR); Seok-Hwan Oh, Yongin-si (KR); Gi-Sung Yeo, Seoul (KR); Hyun-Jae Kang, Gunpo-si (KR); Jang-Ho Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 467 days.

(21) Appl. No.: 11/296,921

(22) Filed: Dec. 8, 2005

(65) Prior Publication Data

US 2006/0131576 A1    Jun. 22, 2006

(30) Foreign Application Priority Data

Dec. 21, 2004   (KR)   .................. 10-2004-0109903

(51) Int. Cl.
*H01L 23/58* (2006.01)
*H01L 29/10* (2006.01)

(52) U.S. Cl. .......... 257/48; 257/E21.318; 257/E21.335; 257/E29.006; 438/462

(58) Field of Classification Search .................. 257/48, 257/E21.318, E21.335, E29.006, E21.102, 257/E21.237; 438/460, 462, 14
See application file for complete search history.

(56) References Cited

U.S. PATENT DOCUMENTS 3,666,573 A * 5/1972 Brackelmanns .............. 438/10
4,018,626 A * 4/1977 Schwuttke et al. .......... 438/393
4,243,937 A * 1/1981 Multani et al. .............. 324/765
4,906,921 A * 3/1990 Juge ........................... 324/766
5,017,514 A * 5/1991 Nishimoto .................... 438/14
5,262,258 A * 11/1993 Yanagisawa ................. 430/22
5,435,659 A * 7/1995 Ueno ....................... 400/615.2
7,174,650 B1 * 2/2007 Marshall ....................... 33/427
7,273,761 B2 * 9/2007 Rumsey et al. .............. 438/14
2006/0131576 A1 * 6/2006 Koh et al. ..................... 257/48
2009/0079449 A1 * 3/2009 Marbler ....................... 324/754

FOREIGN PATENT DOCUMENTS

| KR | 10-2000-0043244 | 7/2000 |
| KR | 10-2003-0059377 | 7/2003 |
| KR | 10-2003-0095457 | 12/2003 |
| KR | 10-0457223 | 11/2004 |

* cited by examiner

*Primary Examiner*—Walter L Lindsay, Jr.
(74) *Attorney, Agent, or Firm*—Mills & Onello LLP

(57) ABSTRACT

There are provided a semiconductor device having an overlay measurement mark, and a method of fabricating the same. The semiconductor device includes a scribe line region disposed on a semiconductor substrate. A first main scale layer having a first group of line and space patterns and a second group of line and space patterns is disposed on the scribe line region. Line-shaped second main scale patterns are disposed on space regions of the first group of the line and space patterns. Line-shaped vernier scale patterns are disposed on space regions of the second group of the line and space patterns. In the method, a first main scale layer having a first group of line and space patterns and a second group of line and space patterns is formed on a semiconductor substrate. Line-shaped second main scale patterns are formed on space regions of the first group of the line and space patterns. Line-shaped vernier scale patterns are formed on space regions of the second group of the line and space patterns.

33 Claims, 17 Drawing Sheets

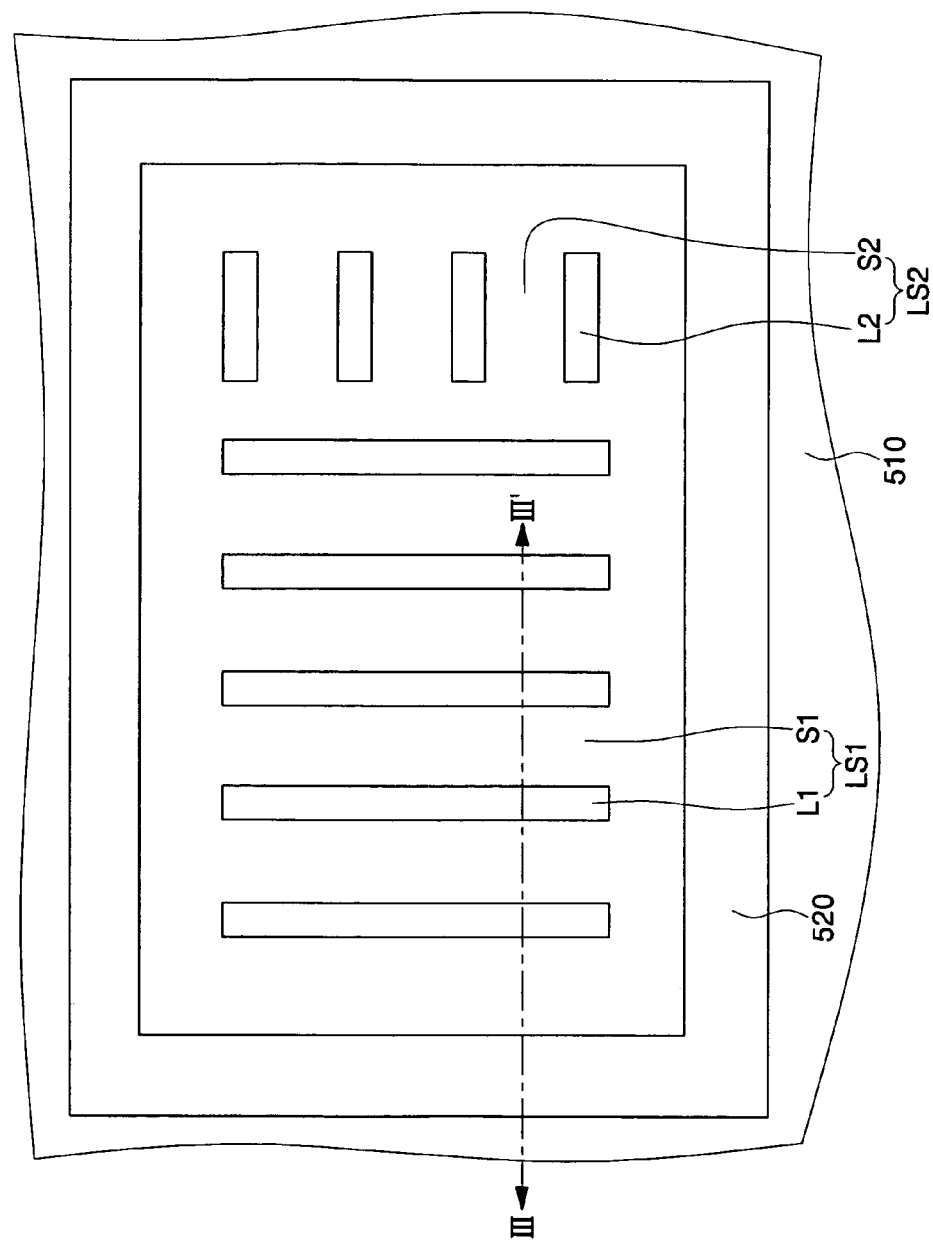

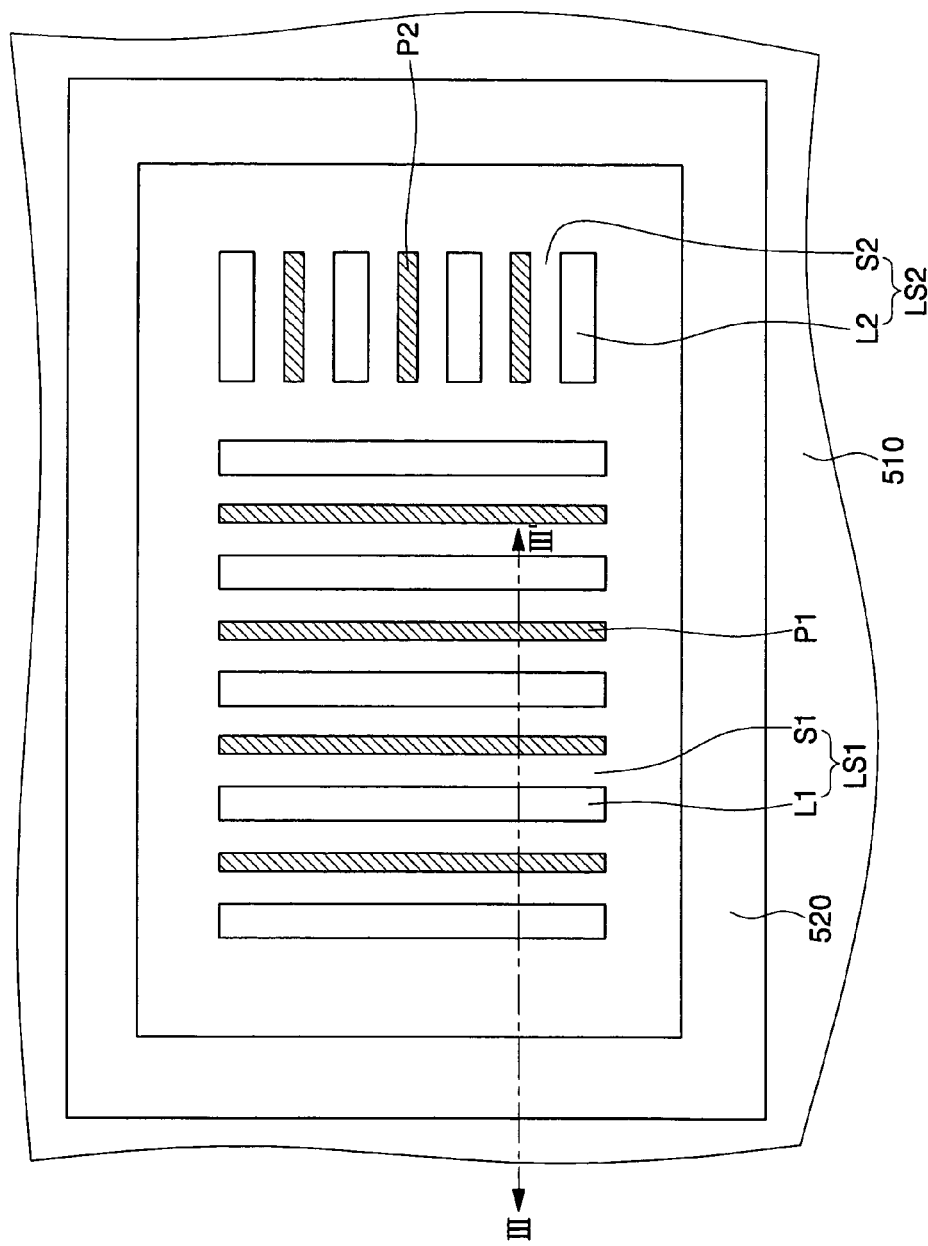

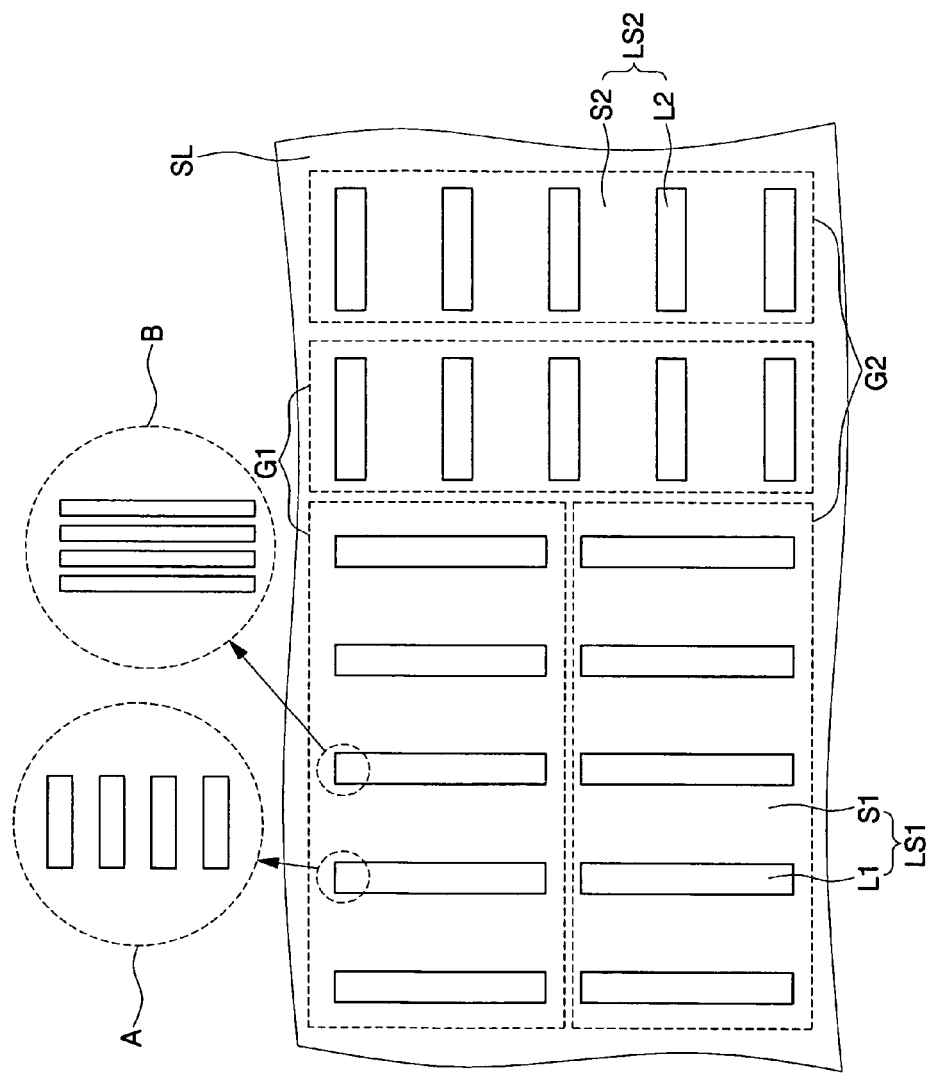

SEMICONDUCTOR DEVICE HAVING OVERLAY MEASUREMENT MARK AND METHOD OF FABRICATING THE SAME

CROSS-REFERENCE TO RELATED APPLICATION

This application claims priority from Korean Patent Application No. 2004-109903, filed on Dec. 21, 2004, the contents of which are hereby incorporated herein by reference in their entirety as if set forth fully herein.

BACKGROUND OF INVENTION

1. Technical Field

The present invention relates to a semiconductor device and a method of fabricating the same, and more particularly, to a semiconductor device having an overlay measurement mark and a method of fabricating the same.

2. Discussion of the Related Art

With semiconductor devices being highly integrated in recent years, a density of patterns formed on a wafer is increased. Specifically, a pattern density in a cell region is very high in comparison with that of a peripheral circuit region. The device elements formed in the cell region or the peripheral circuit region are formed by repeatedly performing processes, such as thin film deposition, a photolithography process, and an etch process.

The photolithography process is performed by repeating, many times, a series of sequential operations including depositing photoresist on a wafer to form a fine pattern on a wafer, exposing the deposited photoresist to transfer a circuit pattern formed on a reticle mask, and developing the exposed photoresist. When the operations of the photolithography process are repeatedly performed, it is necessary to match the patterns formed by a previous process with locations of patterns to be formed in a current process. This is because it is required that a wafer be placed at the same position as in a former pattern formation process in order to transfer a mask pattern of a reticle in a current process, so that interlayer patterns are precisely matched for electrical connection.

In the general semiconductor device fabrication processes, an overlay measurement mark is used to examine whether the patterns formed on an upper layer are matched with the patterns formed on a lower layer. In the conventional method, after box-type or frame-type main scale patterns are formed in a scribe line region in the process of forming a lower pattern, and an upper thin film is deposited thereon, when a photosensitive layer pattern to form a chip pattern is formed, a photosensitive layer pattern to be used as a box-type or frame-type vernier scale pattern is formed inside the main scale patterns, and an overlay between the main scale patterns and the vernier scale patterns is measured.

FIGS. 1A and 2A are plan views illustrating a conventional semiconductor device having an overlay measurement mark, and FIGS. 1B and 2B are sectional views taken along a line of I-I' of FIGS. 1A and 2A, respectively.

Referring to FIGS. 1A and 1B, a main scale layer 15 having a trench box-shaped main scale pattern B1 is disposed on a semiconductor substrate 10. A box-shaped vernier scale pattern B2 is disposed inside the trench box-shaped main scale pattern B1 on the main scale layer 15. The main scale pattern B1 and the vernier scale pattern B2 constitute a box-in-box type overlay measurement mark.

The overlay measurement mark measures the degree that a thin film formed on a wafer in a former process overlays a thin film to be formed in a current process, by measuring a distance between the main scale pattern B1 and the vernier scale pattern B2. The overlay is divided into an x-axis overlay and a y-axis overlay, and the x-axis overlay and the y-axis overlay can be represented by a formula 1 and a formula 2 as follows respectively.

$$x\text{-axis overlay} = (x1 - x2)/2 \quad \text{[Formula 1]}$$

$$y\text{-axis overlay} = (y1 - y2)/2 \quad \text{[Formula 2]}$$

In the formula 1, "x1" and "x2" represent an x-axis distance between the main scale pattern B1 and the vernier scale pattern B2, and in the formula 2, "y1" and "y2" present a y-axis distance between the main scale pattern B1 and the vernier scale pattern B2.

Referring to FIGS. 2A and 2B, a main scale layer 25 having a trench frame-shaped main scale pattern F1 is formed on a semiconductor substrate 20. A frame-shaped vernier scale pattern F2 is disposed inside the frame pattern of the main scale pattern F1 on the main scale layer 25. The main scale pattern F1 and the vernier scale pattern F2 constitute a frame-in-frame type overlay measurement mark. The overlay measurement by the frame-in-frame type overlay measurement mark is made using the equation 1 and the equation 2 described in reference to FIGS. 1A and 1B.

As described above, in the case that the shape of the main scale is distorted due to procedure problems since one measurement mark exists in one region in the conventional box-type or frame-type, a possibility of producing defective semiconductor devices is increased because the measurement of an overlay is not made precisely.

Further, a technology is required to pattern a finer pattern at a more precise position with the increase in integration of semiconductor devices. In order to correspond to the requirements of highly-integrated semiconductor devices, fabrication equipment having a high numerical aperture (NA) of projection lens being capable of increasing a resolution may be employed, or development of light sources having shorter wave lengths such as use of an ArF laser beam may be required so as to form a much finer pattern. However, studies on an overlay measurement mark for exactly patterning at correct positions have not been developed as much as studies on development of resolution as above.

The box type or the frame type described in connection with FIGS. 1A and 2A has a limitation to measuring an overlay below 15 nm required to fabricate a semiconductor device under development below 70 nm. Since the box type or the frame type needs a vernier scale inside a main scale, it has a limitation to reducing a size of an overlay measurement mark. A size of the main scale, which is normally used in the box type or the frame type at present, is 30 to 40 μm, and the size of the main scale does not provide exact results for the overlay measurement below 15 nm required for the 70 nm or less semiconductor device. Further, as the scribe line region may be scaled down in consideration of mass production, a new overlay measurement mark being suitable to meeting the requirements is needed.

SUMMARY OF THE INVENTION

Therefore, the present invention provides a semiconductor device and a method of fabricating the same having an overlay measurement mark being suitable to preventing an overlay failure in a photolithography process by changing a line width and a design of an overlay measurement mark, and thus, reducing an error range between measurement values of the overlay measurement mark, and an overlay of a semiconductor device.

In accordance with one aspect, the present invention provides a semiconductor device having an overlay measurement mark. The semiconductor device includes a scribe line region disposed on a semiconductor substrate. A main scale layer having line and space patterns is disposed on the scribe line region. Line-shaped vernier scale patterns are disposed on space regions of the line and space patterns of the main scale layer. The line-shaped vernier scale patterns have smaller widths than those of line patterns of the main scale layer.

The line patterns of the line and space patterns of the main scale layer may be embossed or recessed patterns.

The line and space patterns of the main scale layer may include vertical patterns and horizontal patterns.

Widths of the space regions of the line and space patterns may be equal to or greater than widths of the line patterns of the line and space patterns. Preferably, a width of each of the line patterns of the line and space patterns of the main scale layer may be 0.1 to 10 µm. Preferably, a width of each of the space regions of the line and space patterns of the main scale layer may be 0.1 to 10 µm. Preferably, a width of each of the vernier scale patterns may be 0.05 to 9.5 µm.

Alternatively, widths of the line patterns of the line and space patterns may be greater than widths of the space regions of the line and space patterns. Preferably, a width of each of the line patterns of the line and space patterns of the main scale layer may be 1 to 50 µm. Preferably, a width of each of the space regions of the line and space patterns of the main scale layer may be 0.3 to 30 µm. Preferably, a width of each of the vernier scale patterns may be 0.1 to 10 µm.

In one embodiment, a length of each of the line and space patterns of the main scale layer is 1 to 50 µm. Lengths of the vernier scale patterns may be equal to lengths of the line and space patterns of the main scale layer.

In one embodiment, the line patterns of the line and space patterns of the main scale layer are composed of a plurality of vertical or horizontal fine line and space patterns.

In one embodiment, the line-shaped vernier scale patterns are composed of a plurality of vertical or horizontal fine line and space patterns.

In one embodiment, the line and space patterns of the main scale layer and the vernier scale patterns constitute an overlay measurement mark. In one embodiment, the device further comprises a protecting layer ring around the measurement mark with 2 to 10 µm. A width of the protecting layer ring may be 1 to 10 µm.

In accordance with another aspect, the present invention provides a semiconductor device having an overlay measurement mark. The semiconductor device includes a scribe line region disposed on a semiconductor substrate. A first main scale layer having a first group of line and space patterns and a second group of line and space patterns is disposed on the scribe line region. Line-shaped second main scale patterns are disposed on space regions of the first group of the line and space patterns. Line-shaped vernier scale patterns are disposed on space regions of the second group of the line and space patterns.

In another aspect of the present invention, the present invention provides a method of fabricating a semiconductor device having an overlay measurement mark. The method includes defining a scribe line region on a semiconductor substrate. A main scale layer having line and space patterns is formed on the scribe line region. Line-shaped vernier scale patterns are formed on space regions of the line and space patterns of the main scale layer, and the vernier scale patterns have smaller widths than those of line patterns of the main scale layer.

In accordance with another aspect, the present invention provides a method of fabricating a semiconductor device having an overlay measurement mark. The method includes defining a scribe line region on a semiconductor substrate. A first main scale layer having a first group of line and space patterns and a second group of line and space patterns is formed on the scribe line region. Line-shaped second main scale patterns are formed on space regions of the first group of the line and space patterns. Line-shaped vernier scale patterns are formed on space regions of the second group of the line and space patterns.

In accordance with still another aspect, the present invention provides a method of fabricating a semiconductor device having an overlay measurement mark. The method includes defining a scribe line region on a semiconductor substrate. A main scale layer having line and space patterns is formed on the scribe line region. Widths of line patterns of the line and space patterns are greater than widths of space regions of the line and space patterns. An intermediate layer is formed on the semiconductor substrate having the main scale layer. The intermediate layer is formed to have a step height difference on the line patterns of the main scale layer. Line-shaped vernier scale patterns are formed on the intermediate layer on the space regions of the line and space patterns of the main scale layer. Widths of the vernier scale patterns are smaller than widths of the space regions of the main scale layer.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 5A and 6A are plan views illustrating a method of fabricating a semiconductor device having an overlay measurement mark according to another embodiment of the present invention;

FIGS. 10A, 11A and 12A are plan views illustrating a method of fabricating a semiconductor device having an overlay measurement mark according to further another embodiment of the present invention.

DETAILED DESCRIPTION OF THE INVENTION

Figure 1A:
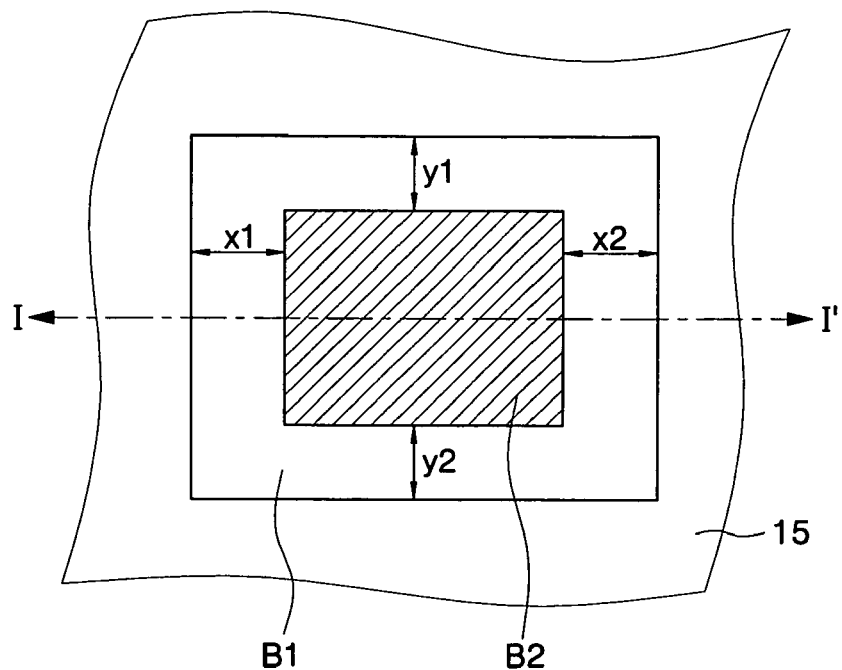
FIGS. 1A and 2A are plan views illustrating a conventional semiconductor device having an overlay measurement mark.
Figure 1B:
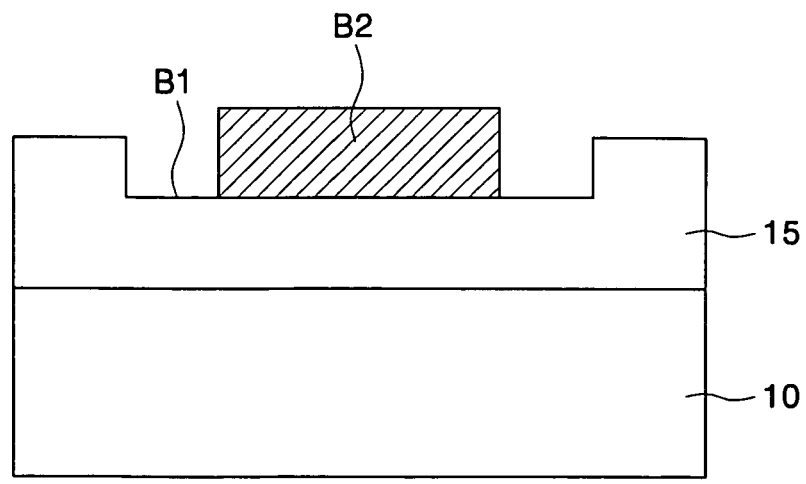
FIGS. 1B and 2B are sectional views taken along a line of I-I' of FIGS. 1A and 2A, respectively.

The present invention will now be described more fully hereinafter with reference to the accompanying drawings, in which preferred embodiments of the invention are shown. In the drawings, the thicknesses of layers and regions are exaggerated for clarity.

Figure 3A:
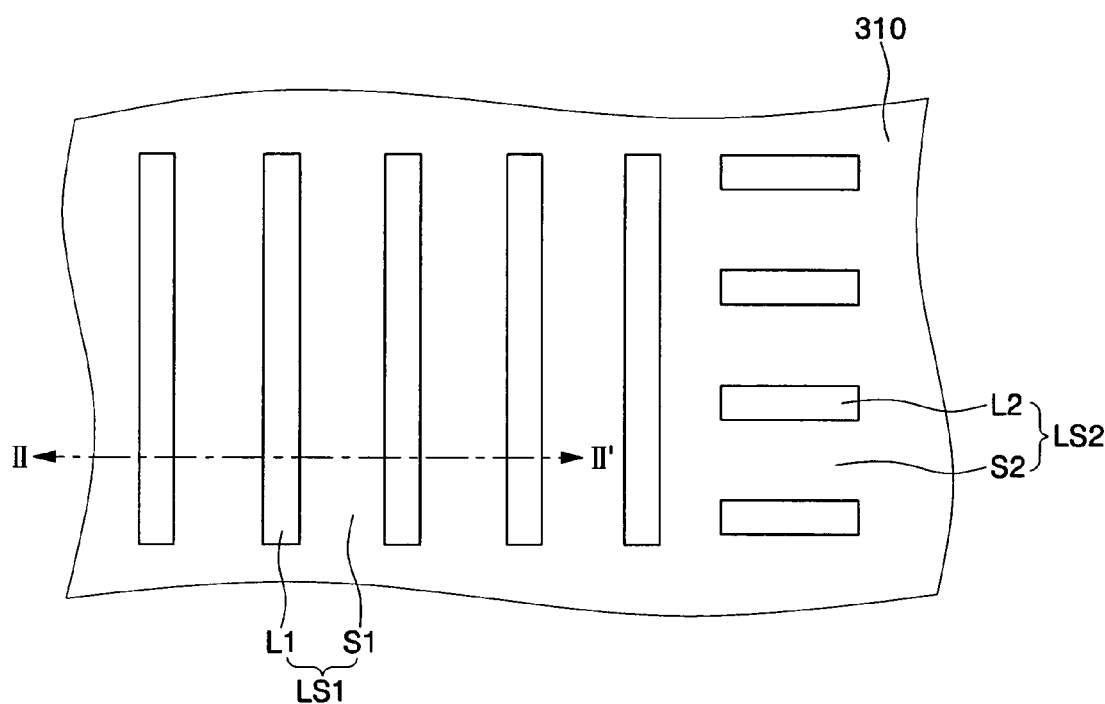
FIGS. 3A and 4A are plan views illustrating a method of fabricating a semiconductor device having an overlay measurement mark according to an embodiment of the present invention.
Figure 3B:
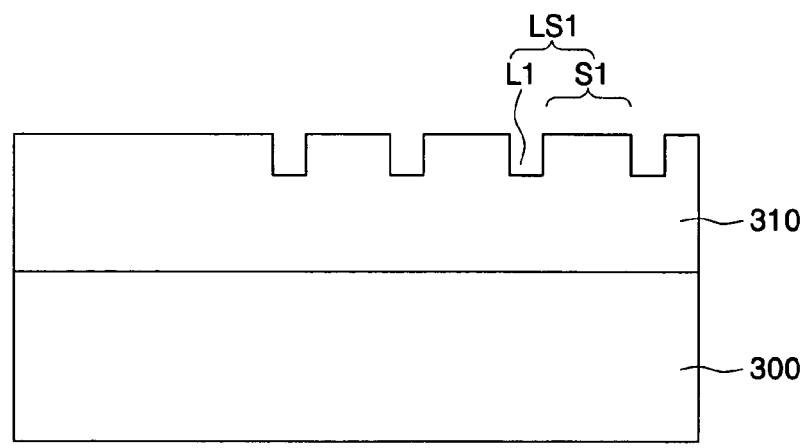
FIGS. 3B and 4B are sectional views taken along a line of II-II' of FIGS. 3A and 4A, respectively.
Figure 4A:
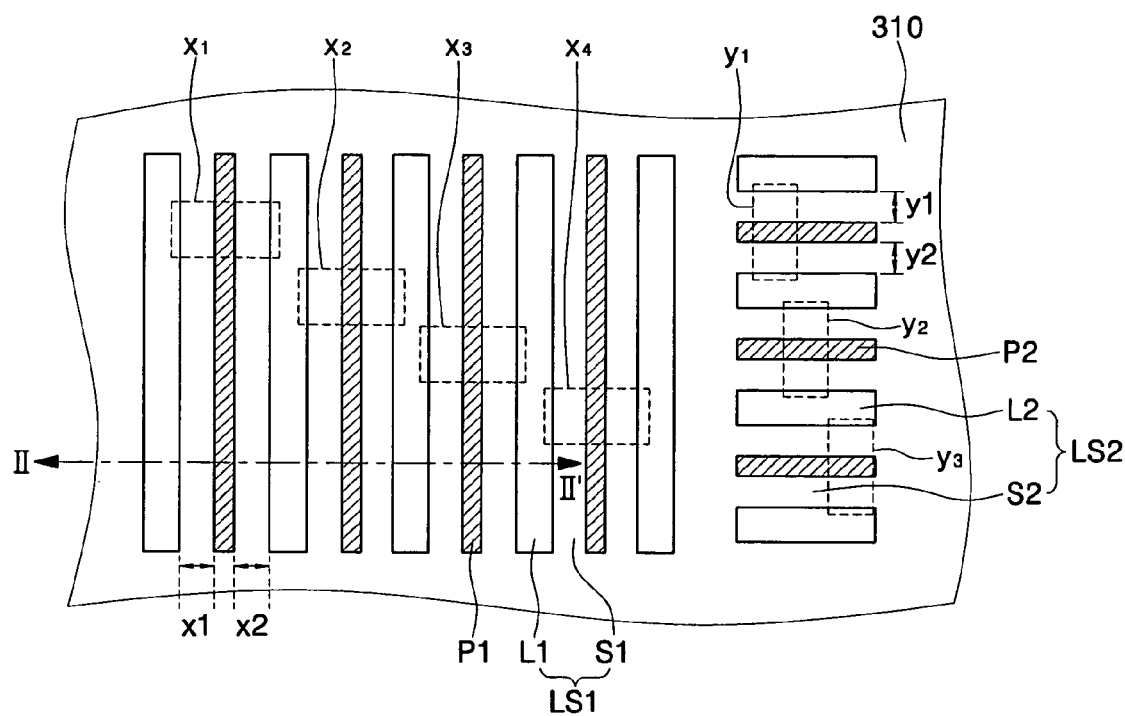
Figure 4B:
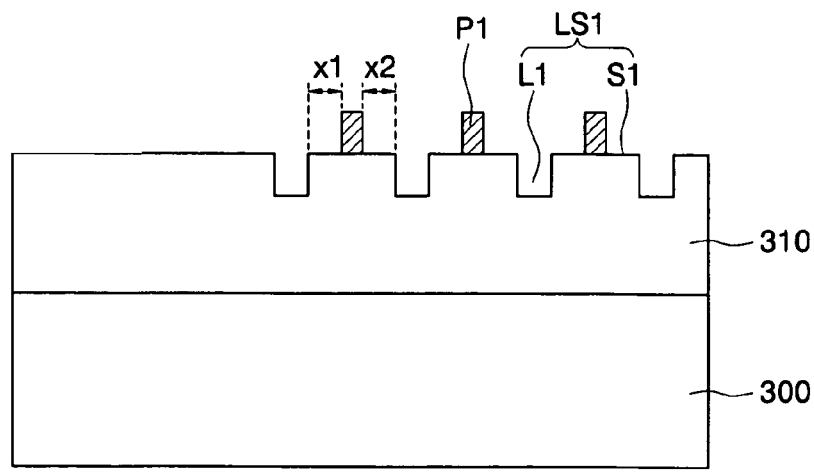

FIGS. 3A and 4A are plan views illustrating a method of fabricating a semiconductor device having an overlay measurement mark according to an embodiment of the present invention. FIGS. 3B and 4B are sectional views taken along a line of II-II' of FIGS. 3A and 4A, respectively.

Referring to FIGS. 3A and 3B, a scribe line region is defined on a semiconductor substrate 300. A lower layer is formed on the semiconductor substrate 300 of the scribe line region. The lower layer is patterned, thereby forming a main scale layer 310 having vertical line and space patterns LS1 and horizontal line and space patterns LS2. The vertical line and space patterns LS1 and the horizontal line and space patterns LS2 may be formed near each other, or may be formed separately inside the scribe line region. The line and space patterns LS1, LS2 of the main scale pattern 310 include line patterns L1, L2 and space regions S1, S2. The line patterns L1, L2 of the main scale layer 310 may be formed as recessed patterns or embossed patterns, and in this embodiment, they are formed as recessed patterns.

In one embodiment, widths of the space regions S1, S2 in the line and space patterns are equal to or greater than widths of the line patterns L1, L2 of the line and space patterns. Specifically, the widths of the line patterns L1, L2 in the line and space patterns may be 0.1 to 10 μm. The widths of the space regions S1, S2 in the line and space patterns may be 0.1 to 10 μm. The lengths of the line and space patterns LS1, LS2 may be 1 to 50 μm.

Referring to FIGS. 4A and 4B, line-shaped vernier scale patterns P1, P2 having smaller widths than those of the line patterns L1, L2 of the main scale layer on the space regions S1, S2 of the line and space patterns LS1, LS2 of the main scale layer 310. The widths of the vernier scale patterns P1, P2 may be 0.05 to 9.5 μm. The lengths of the vernier scale patterns P1, P2 are preferably equal to the lengths of the line and space patterns LS1, LS2 of the main scale layer 310.

The line and space patterns LS1, LS2 of the main scale layer 310 and the vernier scale patterns P1, P2 are used as an overlay measurement mark. The overlay measurement mark measures the degree that a thin film formed on a wafer in a prior process overlays a thin film to be formed in a current process, by measuring distances between the line and space patterns LS1, LS2 of the main scale layer 310 and the vernier scale patterns P1, P2. The overlay is divided into an x-axis overlay and a y-axis overlay. The x-axis overlay is represented by measuring distances x1, x2 between the vertical line and space patterns LS1 and the vernier scale patterns P1 disposed between them, and the y-axis overlay is represented by measuring distances y1, y2 between the horizontal line and space patterns LS2 and the vernier scale patterns P2 disposed between them. The x-axis overlay and the y-axis overlay can be represented by formula 3 and formula 4 as follows respectively.

$$x\text{-axis overlay}=(x_1+x_2+\ldots+x_n)/n$$

Herein, $x_1=(x_11-x_12)/2$, $x_2=(x_21-x_22)/2$, ..., $x_n=(x_n1-x_n2)/2$ [Formula 3]

$$y\text{-axis overlay}=(y_1+y_2+\ldots+y_n)/n$$

Herein, $y_1=(y_11-y_12)/2$, $y_2=(y_21-y_22)/2$, ... $y_n=(y_n1-y_n2)/2$ [Formula 4]

In the conventional box type or frame type patterns, in the case that a main scale or a vernier scale is distorted due to procedure problems because only one measurement mark exists in one region, exact overlay measurement was not made. However, in the case of measuring overlay using the overlay measurement mark according to the present invention, at least two measurement values and an average value of the measurement values are achieved. Further, even if distorted patterns are partially formed due to procedure problems, values at the distorted patterns are excluded and thus, a reliability of overlay measurement values can be increased with rest of measurement values data. Thus, semiconductor fabrication is continuously performed using the improved overlay measurement mark, thereby minimizing an overlay failure ratio in a semiconductor device, and increasing a production yield of semiconductor devices.

Figure 5B:
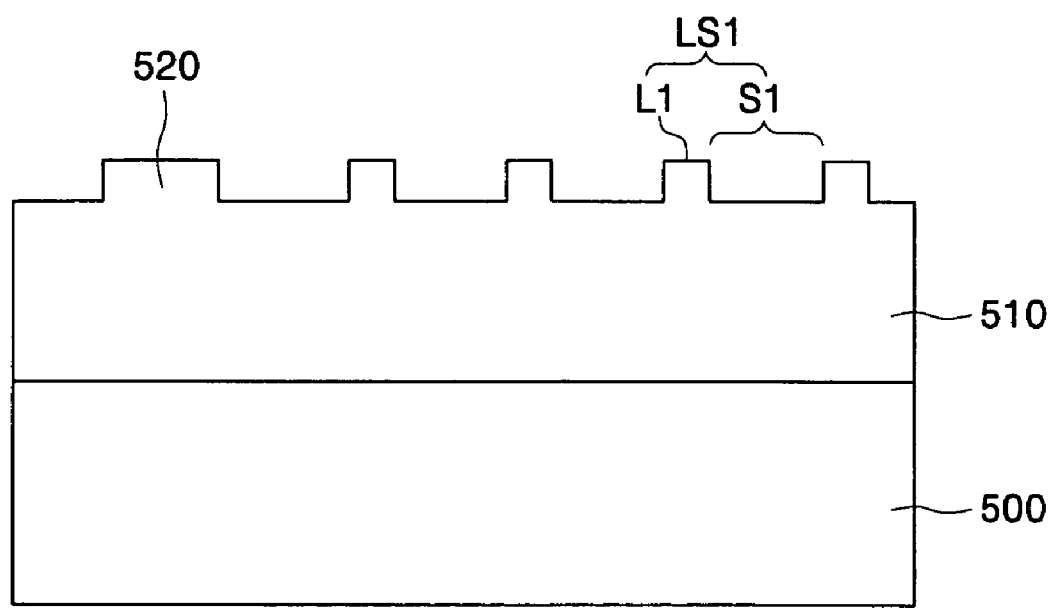
FIGS. 5B and 6B are sectional views taken along a line of III-III' of FIGS. 5A and 6A, respectively.
Figure 6B:
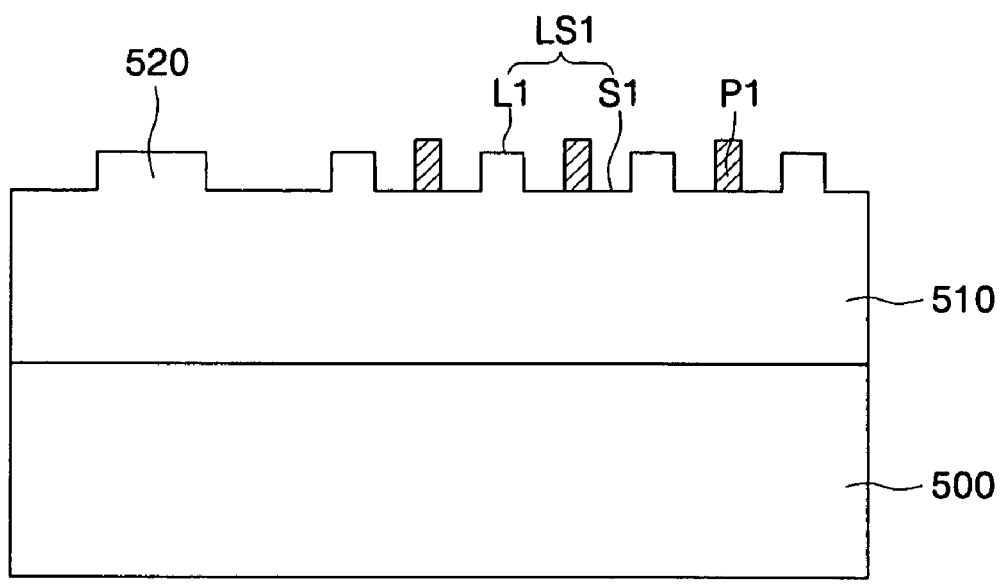

FIGS. 5A and 6A are plan views illustrating a method of fabricating a semiconductor device having an overlay measurement mark according to another embodiment of the present invention. FIGS. 5B and 6B are sectional views taken along a line of III-III' of FIGS. 5A and 6A, respectively.

Referring to FIGS. 5A and 5B, a scribe line region is defined on a semiconductor substrate 500. A lower layer is formed on the semiconductor substrate 500 of the scribe line region. The lower layer is patterned, thereby forming a main scale layer 510 having vertical line and space patterns LS1 and horizontal line and space patterns LS2. The vertical line and space patterns LS1 of the main scale pattern 510 include vertical line patterns L1, and vertical space regions S1. The horizontal line and space patterns LS2 of the main scale pattern 510 include horizontal line patterns L2, and horizontal space regions S2. The vertical line and space patterns LS1 and the horizontal line and space patterns LS2 may be formed near each other, or may be formed separately inside the scribe line region. The line patterns L1, L2 of the main scale layer may be formed as recessed patterns or embossed patterns, and in this embodiment, they are formed as embossed patterns.

In one embodiment, widths of the space regions S1, S2 in the line and space patterns are equal to or greater than widths of the line patterns L1, L2 of the line and space patterns. Specifically, the widths of the line patterns L1, L2 in the line and space patterns may be 0.1 to 10 μm. The widths of the space regions S1, S2 in the line and space patterns may be 0.1 to 10 μm. The lengths of the line and space patterns LS1, LS2 may be 1 to 50 μm.

Further, a protecting layer ring 520 may be formed around the line and space patterns LS1, LS2 of the main scale layer 510 to be spaced from the line and space patterns LS1, LS2 with 2 to 10 μm. The protecting layer ring 520 is formed as an embossed ring. A width of the protecting layer ring 520 may be 1 to 10 μm. The protecting layer ring 520 may be formed to protect the line and space patterns LS1, LS2 in subsequent processes such as a chemical mechanical polishing (CMP) process.

Referring to FIGS. 6A and 6B, line-shaped vernier scale patterns P1, P2 are formed on the space regions S1, S2 of the line and space patterns LS1, LS2 of the main scale layer 510, and the vernier scale patterns P1, P2 have smaller widths than those of the line patterns L1, L2 of the main scale layer. The widths of the vernier scale patterns P1, P2 may be 0.05 to 9.5 μm. The lengths of the vernier scale patterns P1, P2 are preferably equal to those of the line and space patterns LS1, LS2 of the main scale layer 510.

The line and space patterns LS1, LS2 of the main scale layer 510, and the vernier scale patterns P1, P2 are used as an overlay measurement mark. The overlay measurement mark measures the degree that a thin film formed on a wafer in a former process overlays a thin film to be formed in a current process, by measuring distances between the line and space patterns LS1, LS2 of the main scale layer 510 and the vernier scale patterns P1, P2. The overlay is divided into an x-axis overlay and a y-axis overlay. The x-axis overlay is presented by measuring distances between the vertical line and space patterns LS1 and the vernier scale patterns P1 disposed between them, and the y-axis overlay is presented by measuring distances between the horizontal line and space patterns LS2 and the vernier scale patterns P2 disposed between them. The x-axis overlay and the y-axis overlay can be presented by formula 3 and formula 4 as explained in reference to FIG. 4A.

Figure 7A:
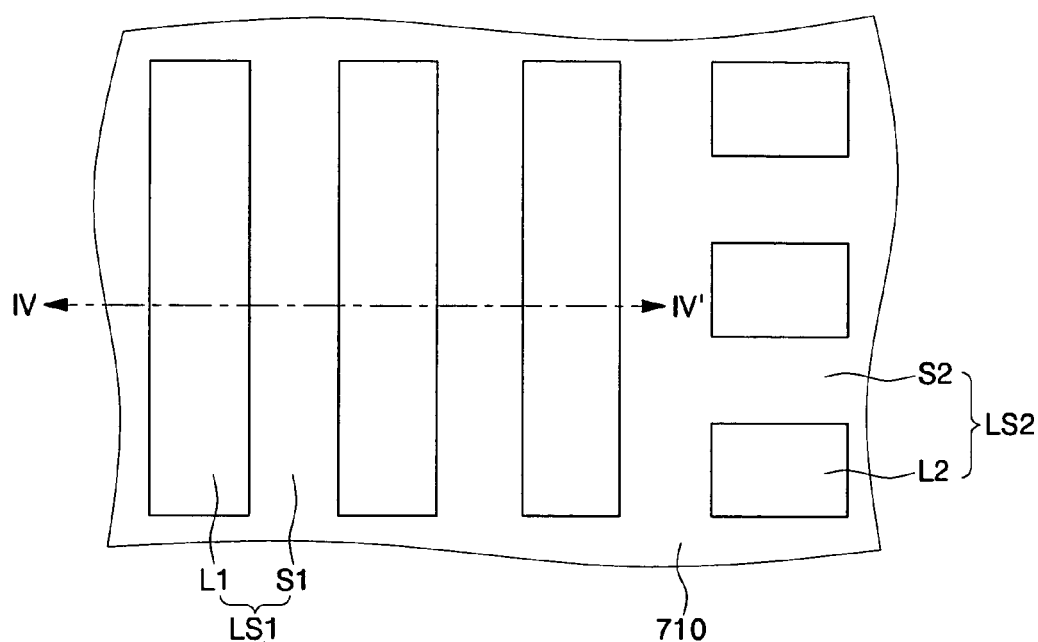
FIGS. 7A, 8A and 9A are plan views illustrating a method of fabricating a semiconductor device having an overlay measurement mark according to still another embodiment of the present invention.
Figure 7B:
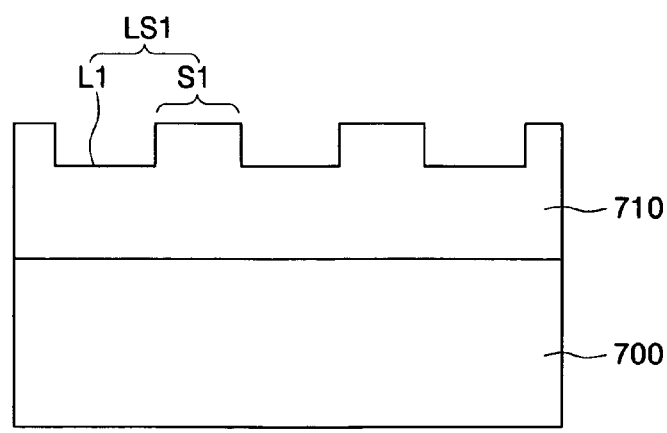
FIGS. 7B, 8B and 9B are sectional views taken along a line of IV-IV' of FIGS. 7A, 8A and 9A, respectively.
Figure 8A:
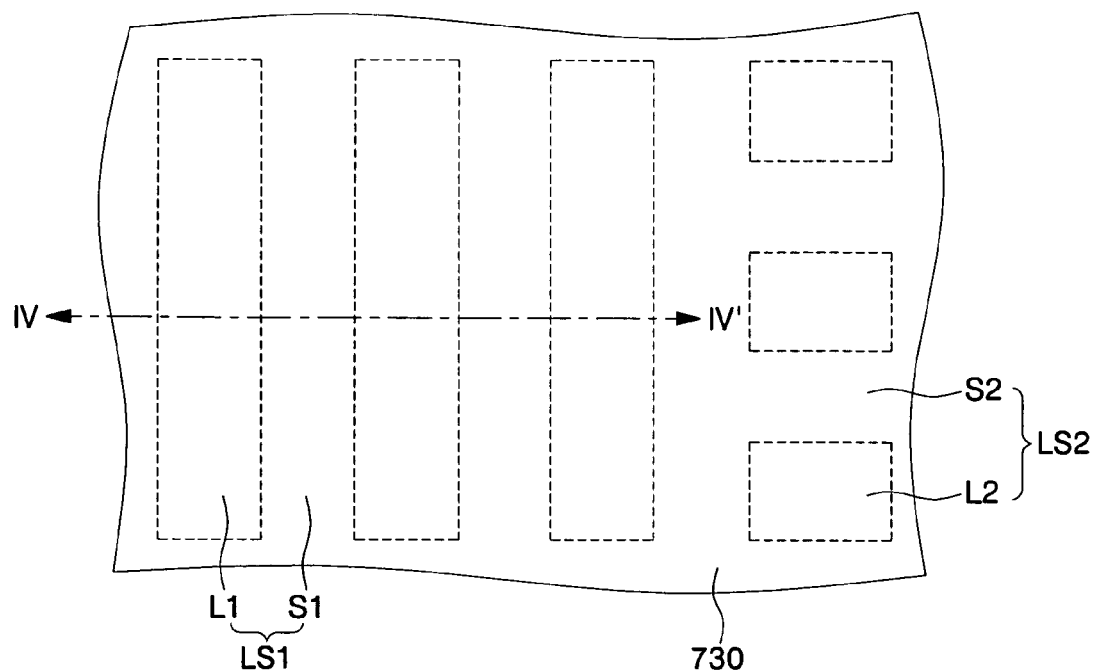
Figure 8B:
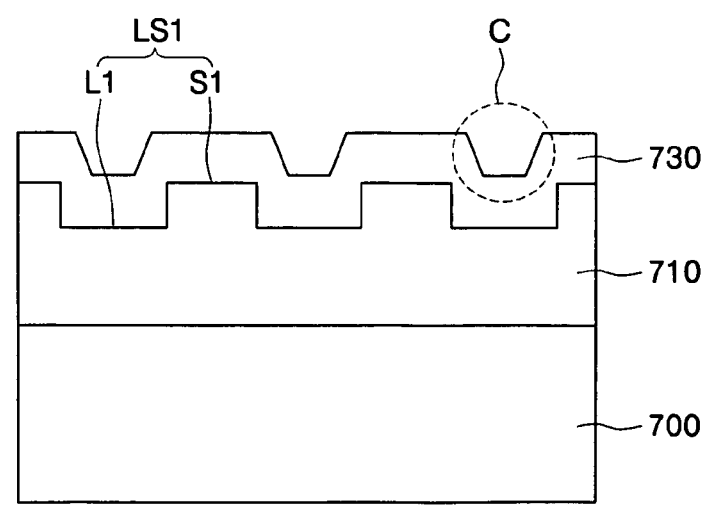
Figure 9A:
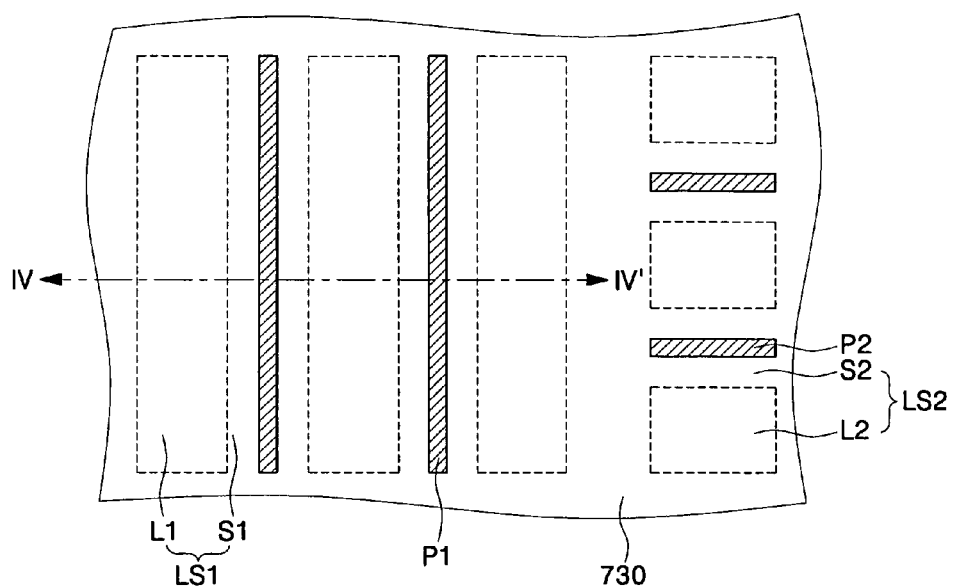
Figure 9B:
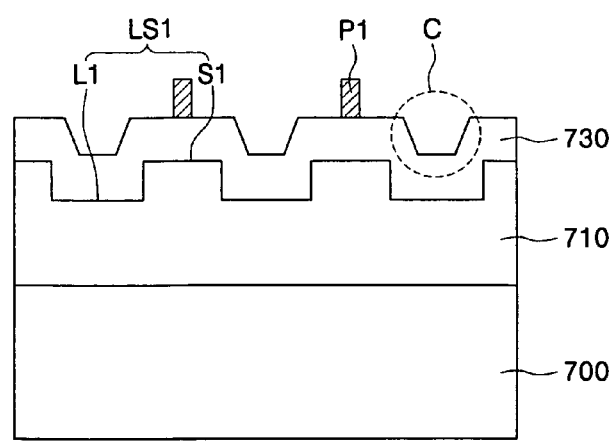

FIGS. 7A, 8A and 9A are plan views illustrating a method of fabricating a semiconductor device having an overlay measurement mark according to still another embodiment of the present invention. FIGS. 7B, 8B and 9B are sectional views taken along a line of IV-IV' of FIGS. 7A, 8A and 9A, respectively.

Referring to FIGS. 7A and 7B, a scribe line region is defined on a semiconductor substrate 700. A lower layer is formed on the semiconductor substrate 700 of the scribe line region. The lower layer is patterned, thereby forming a main scale layer 710 having vertical line and space patterns LS1 and horizontal line and space patterns LS2. The vertical line and space patterns LS1 of the main scale pattern 710 include vertical line patterns L1, and vertical space regions S1. The horizontal line and space patterns LS2 of the main scale pattern 710 include horizontal line patterns L2, and horizontal space regions S2. The vertical line and space patterns LS1 and the horizontal line and space patterns LS2 may be formed near each other, or may be formed separately inside the scribe line region. In one embodiment, widths of the line patterns L1, L2 in the line and space patterns are greater than widths of the space regions S1, S2 of the line and space patterns. In one embodiment, the line patterns L1, L2 of the main scale layer 710 may be formed as recessed patterns.

Specifically, the widths of the space regions S1, S2 in the line and space patterns may be 0.3 to 30 μm. The widths of the line patterns L1, L2 of the line and space patterns of the main scale layer 710 may be 1 to 50 μm. The lengths of the line and space patterns LS1, LS2 of the main scale layer may be 1 to 50 μm.

Referring to FIGS. 8A and 8B, an intermediate layer 730 is formed on the semiconductor substrate having the main scale layer 710. The intermediate layer 730 is formed to have a step height difference C on the line patterns L1, L2 of the main scale layer 710.

Referring to FIGS. 9A and 9B, line-shaped vernier scale patterns P1, P2 are formed on the intermediate layer 730 on the space regions S1, S2 of the line and space patterns LS1, LS2 of the main scale layer 710. Widths of the vernier scale patterns P1, P2 are preferably smaller than those of the space regions S1, S2 of the main scale layer. The widths of the vernier scale patterns P1, P2 may be 0.1 to 10 μm. The lengths of the vernier scale patterns P1, P2 are preferably equal to those of the line and space patterns LS1, LS2 of the main scale layer 710.

The step height difference C of the intermediate layer 730 on the main scale layer 710 and the vernier scale patterns P1, P2 are used as an overlay measurement mark. Signals can be achieved using edge detection of the step height difference C of the intermediate layer 730. For this purpose, the line patterns L1, L2 of the main layer 710 are preferably formed to have relatively large widths in consideration of a thickness of the intermediate layer 730 such that the step height difference C is not removed when the intermediate layer 730 is formed during a subsequent process.

Figure 2A:
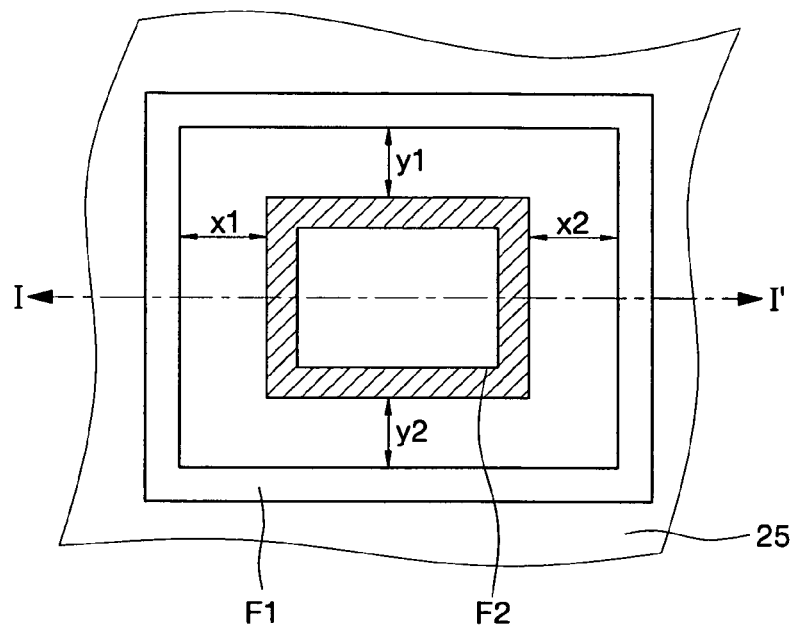
Figure 2B:
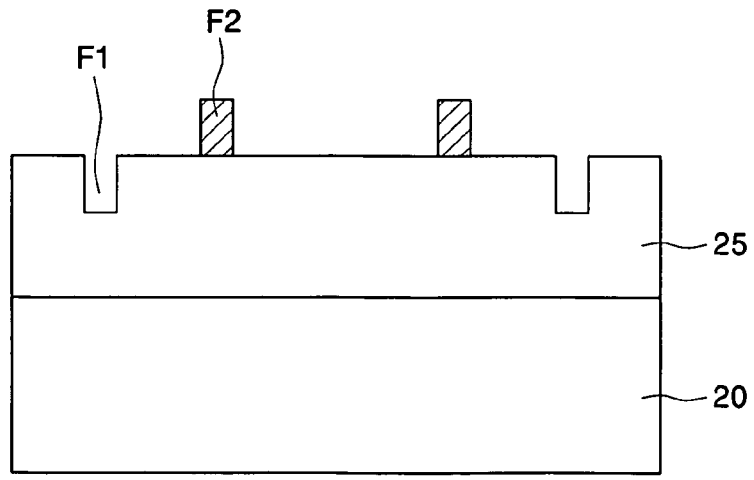
Figure 10B:
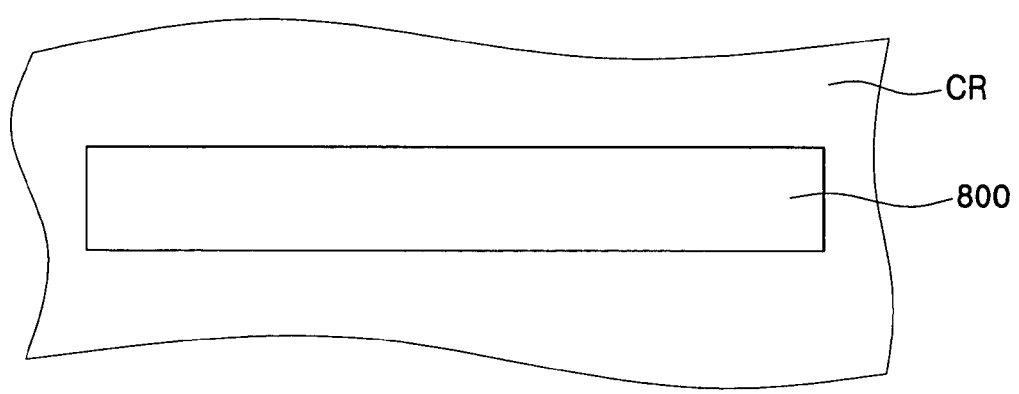
FIGS. 10B, 11B and 12B are plan views illustrating patterns inside a chip formed concurrently with FIGS. 10A, 11A and 12A, respectively.
Figure 11A:
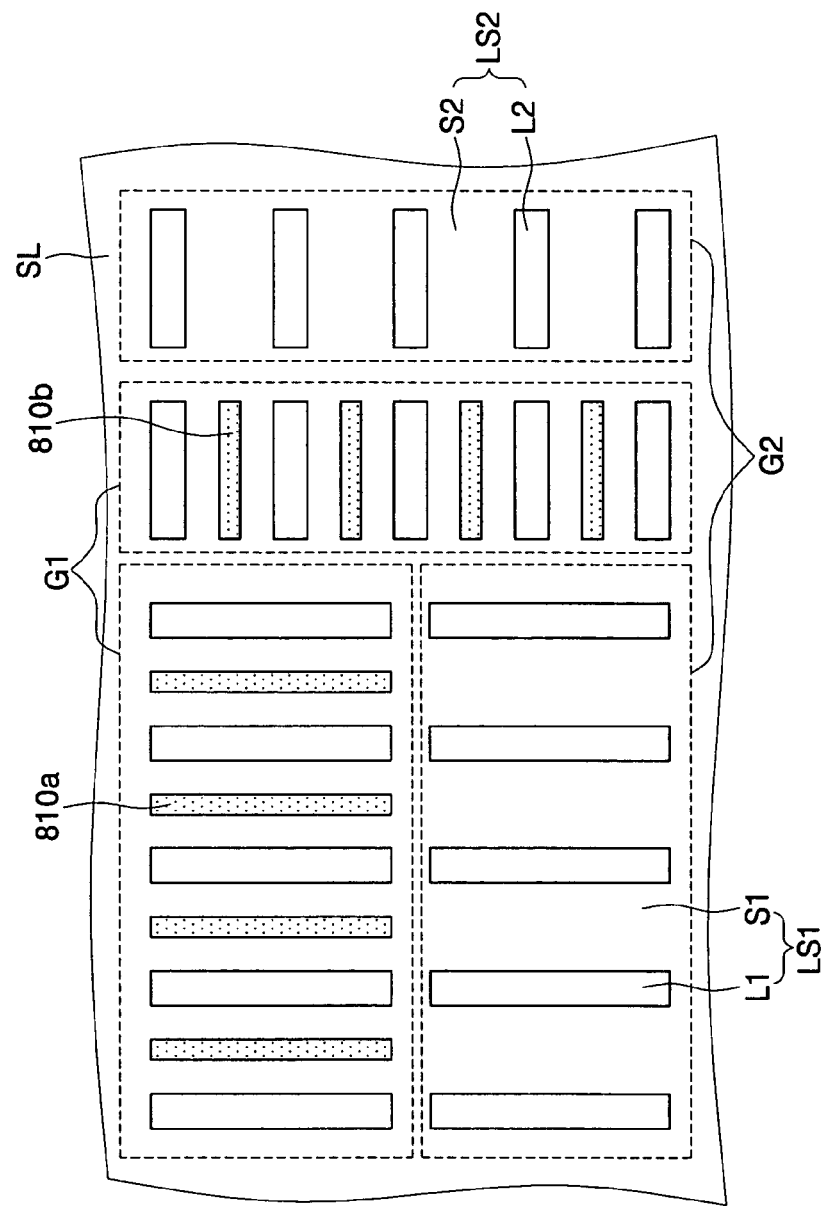
Figure 11B:
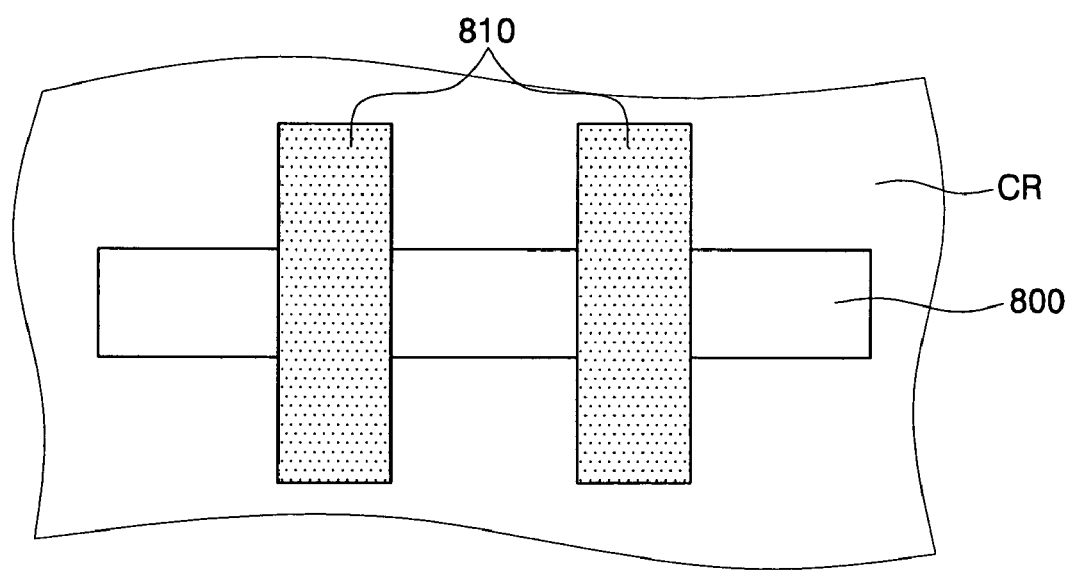
Figure 12A:
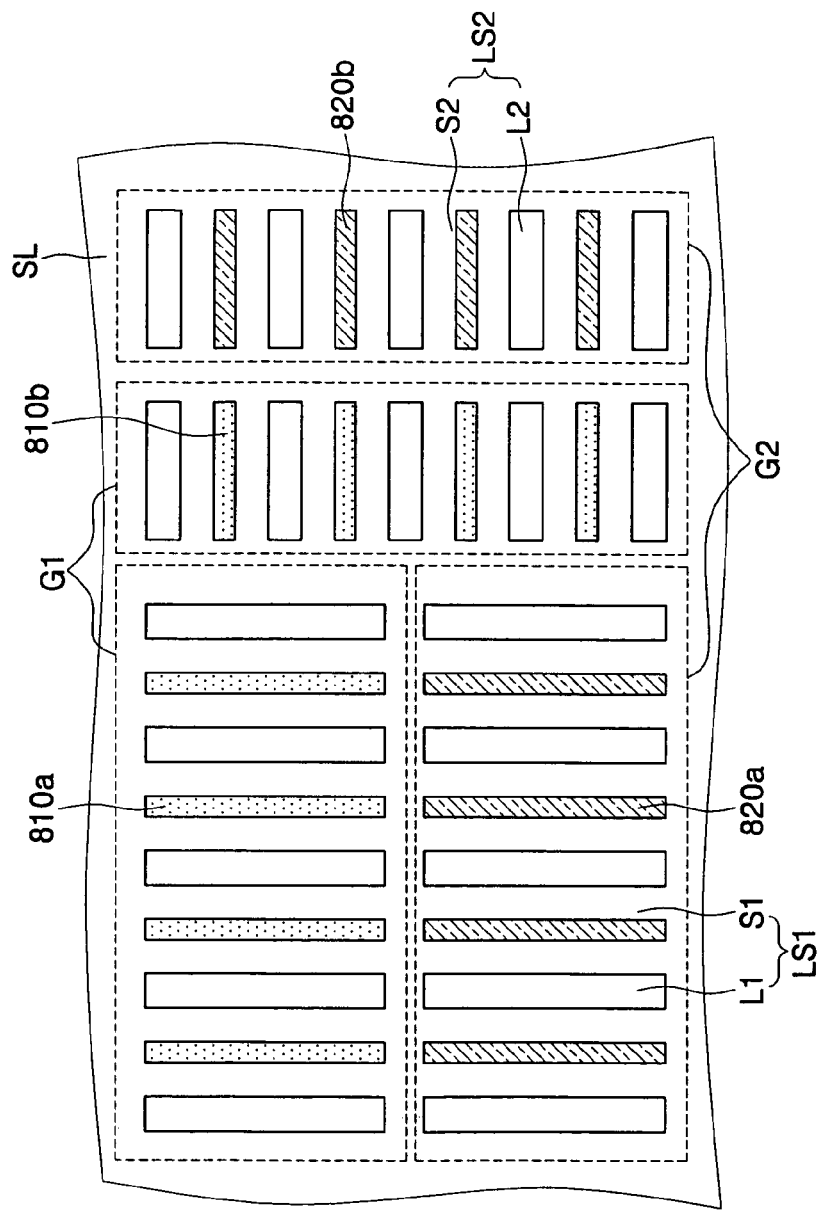
Figure 12B:
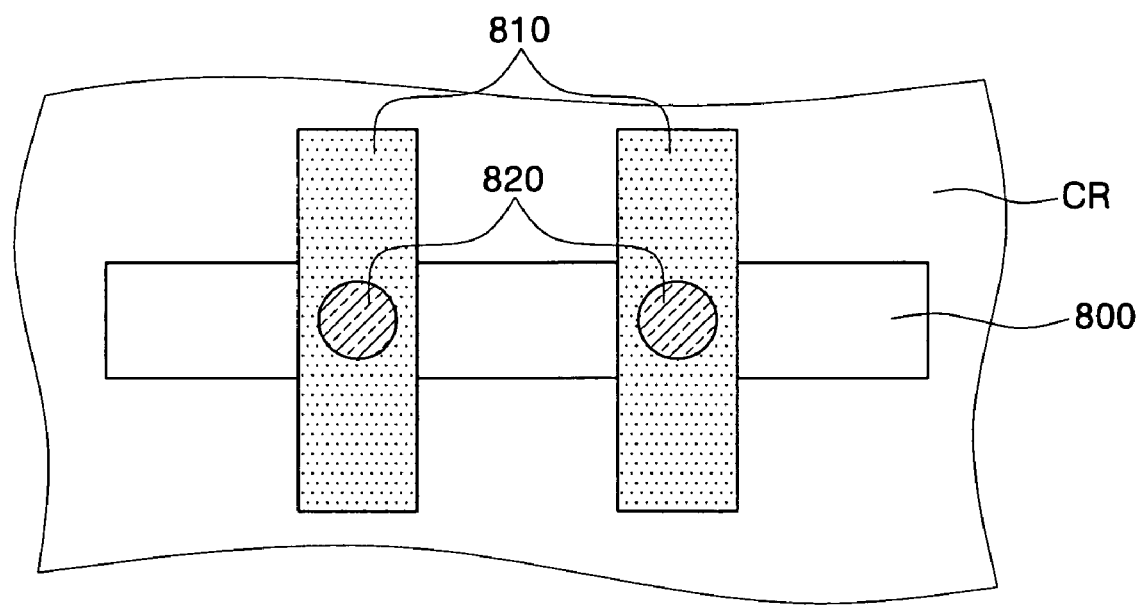

FIGS. 10A, 11A and 12A are plan views illustrating a method of fabricating a semiconductor device having an overlay measurement mark according to further another embodiment of the present invention. FIGS. 10B, 11B and 12B are plan views illustrating patterns inside a chip formed concurrently with FIGS. 10A, 11A and 2A, respectively.

Referring to FIGS. 10A and 10B, a scribe line region SL and a chip region CR are defined on a semiconductor substrate. A lower layer is formed on the semiconductor substrate. The lower layer is patterned, thereby forming a first main scale layer having a first group G1 and a second group G2, which are composed of vertical line and space patterns LS1 and horizontal line and space patterns LS2 on the semiconductor substrate of the scribe line region SL. The vertical line and space patterns LS1 of the first main scale layer include vertical line patterns L1, and vertical space regions S1. The horizontal line and space patterns LS2 of the first main scale layer include horizontal line patterns L2, and horizontal space regions S2. Further, concurrently, a first pattern 800 is formed on the semiconductor substrate of the chip region CR.

The vertical line and space patterns LS1 and the horizontal line and space patterns LS2 may be formed near each other, or may be formed separately inside the scribe line region SL. The first group G1 and the second group G2 may be formed near each other, or may be formed separately inside the scribe line region SL. The line patterns L1, L2 of the line and space patterns of the first main scale layer may be formed as recessed patterns or embossed patterns. The widths of the line patterns L1, L2 of the line and space patterns of the first main scale layer may be 0.1 to 10 μm. Preferably, the widths of the space regions S1, S2 of the line and space patterns of the first main scale layer may be 0.2 to 11 μm. The lengths of the line and space patterns LS1, LS2 of the first main scale layer may be 1 to 50 μm.

When the first main scale layer is formed, the line patterns L1, L2 of the line and space patterns LS1, LS2 of the first group G1 and the second group G2 may be composed of a plurality of horizontal fine line and space patterns A or a plurality of vertical fine line and space patterns B.

Referring to FIGS. 11A and 11B, line-shaped second main scale patterns 810a, 810b are formed on the space regions S1, S2 of the line and space patterns LS1, LS2 of the first group G1, respectively. Concurrently, a second pattern 810 is formed to cross the first pattern 800, on the semiconductor substrate having the first pattern 800 of the chip region CR.

The widths of the second main scale patterns 810a, 810b are preferably equal to or smaller than those of the line patterns L1, L2 of the first main scale layer. The widths of the second main scale patterns 810a, 810b may be 0.1 to 10 μm. The lengths of the second main scale patterns 810a, 810b are preferably equal to those of the line and space patterns LS1, LS2 of the first group G1. The second main scale patterns 810a, 810b may be composed of a plurality of horizontal fine line and space patterns or a plurality of vertical fine line and space patterns.

Referring to FIGS. 12A and 12B, line-shaped vernier scale patterns 820a, 820b are formed on the space regions S1, S2 of the line and space patterns of the second group G2. Concurrently, a contact plug 830 penetrating the first pattern 800 and the second pattern 810 is formed on the semiconductor substrate having the second pattern 810 of the chip region CR.

The widths of the vernier scale patterns 820a, 820b are preferably equal to or smaller than those of the line patterns L1, L2 of the first main scale layer The widths of the vernier scale patterns 820a, 820b may be 0.1 to 10 μm. The lengths of the vernier scale patterns 820a, 820b are preferably equal to those of the line and space patterns LS1, LS2 of the second group G2. The vernier scale patterns 820a, 820b may be composed of a plurality of horizontal fine line and space patterns or a plurality of vertical fine line and space patterns.

The line and space patterns LS1, LS2 of the first main scale layer, the second main scale patterns 810a, 810b, and the vernier scale patterns 820a, 820b are used as an overlay measurement mark. The overlay measurement mark measures an overlay between the line and space patterns LS1, LS2 of the first main scale layer and the second main scale patterns 810a, 810b, and an overlay between the line and space patterns LS1, LS2 of the first main scale layer and the vernier scale patterns 820a, 820b concurrently. Thus, as shown in FIGS. 10B, 11B, and 12B, an overlay measurement mark, which is composed of the line and space patterns LS1, LS2 of the first main scale layer, the second main scale patterns 810a, 810b, and the vernier scale patterns 820a, 820b, can be used to form at cross points of the first pattern and the second pattern exactly like the contact plug 830 inside the chip region CR.

A semiconductor device having an overlay measurement mark according to embodiments of the present invention will be described in reference to FIGS. 6A and 12A.

FIG. 6A is a plan view illustrating a semiconductor device having an overlay measurement mark according to an embodiment of the present invention.

Referring to FIG. 6A, a scribe line region is formed on a semiconductor substrate. A main scale layer having vertical and horizontal line and space patterns LS1, LS2 is disposed on the scribe line region. The vertical line and space patterns LS1 includes vertical line patterns L1 and vertical space regions S1. Further, the horizontal line and space patterns LS2 includes horizontal line patterns L2 and horizontal space regions S2. Line-shaped vernier scale patterns P1, P2 are disposed on the space regions S1, S2 of the line and space patterns of the main scale layer. At this time, line pattern widths of the vernier scale patterns P1, P2 are smaller than those of the line patterns L1, L2 of the main scale layer.

The line patterns L1, L2 of the line and space patterns of the main scale layer may be recessed patterns or embossed patterns. The widths of the space regions S1, S2 of the line and space patterns may be equal to or greater than those of the line patterns L1, L2 of the line and space patterns. The widths of the line patterns L1, L2 of the line and space patterns of the main scale layer are preferably 0.1 to 10 μm. The widths of the space regions S1, S2 of the line and space patterns of the main scale layer are preferably 0.1 to 10 μm. The widths of the vernier scale patterns P1, P2 are preferably 0.05 to 9.5 μm.

Alternatively, the widths of the line patterns L1, L2 of the line and space patterns may be larger than those of the space regions S1, S2 of the line and space patterns. Specifically, the widths of the line patterns L1, L2 of the line and space patterns of the main scale layer are preferably 1 to 50 μm. The widths of the space regions S1, S2 of the line and space patterns of the main scale layer are preferably 0.3 to 30 μm. The widths of the vernier scale patterns P1, P2 are preferably 0.1 to 10 μm.

The lengths of the line and space patterns LS1, LS2 of the main scale layer are preferably 1 to 50 μm. The lengths of the vernier scale patterns P1, P2 may be equal to those of the line and space patterns LS1, LS2 of the main scale layer. The line patterns L1, L2 of the line and space patterns of the main scale layer may be composed of a plurality of vertical fine line and space patterns or a plurality of horizontal fine line and space patterns. Further, the line-shaped vernier scale patterns P1, P2 may be composed of a plurality of vertical or horizontal fine line and space patterns. The line and space patterns LS1, LS2 of the main scale layer and the vernier scale patterns P1, P2 constitute an overlay measurement mark. A protecting layer ring 520 may be disposed around the overlay measurement mark to be spaced therefrom with 2 to 10 μm. A width of the protecting layer ring 520 is preferably 1 to 10 μm.

FIG. 12A is a plan view illustrating a semiconductor device having an overlay measurement mark according to another embodiment of the present invention.

Referring to FIG. 12A, a scribe line region SL is formed on a semiconductor substrate. A first main scale layer having a first group G1 and a second group G2 having vertical and horizontal line and space patterns LS1, LS2 is disposed on the scribe line region. The vertical line and space patterns LS1 includes vertical line patterns L1 and vertical space regions S1. Further, the horizontal line and space patterns LS2 includes horizontal line patterns L2 and horizontal space regions S2. Line-shaped second main scale patterns 810a, 810b are disposed on the space regions S1, S2 of the line and space patterns of the first group G1. Line-shaped vernier scale patterns 820a, 820b are disposed on the space regions S1, S2 of the line and space patterns of the second group G2. The line and space patterns LS1, LS2 of the first main scale layer, the second main scale patterns 810a, 810b, and the vernier scale patterns 820a, 820b constitute an overlay measurement mark.

The line patterns L1, L2 of the first main scale layer may be embossed patterns or recessed patterns. The line patterns L1, L2 of the line and space patterns of the first group G1 and the second group G2 may be composed of a plurality of vertical or horizontal fine line and space patterns. The second main scale patterns 810a, 810b may be composed of a plurality of vertical or horizontal fine line and space patterns. The vernier scale patterns 820a, 820b may be composed of a plurality of vertical or horizontal fine line and space patterns.

The widths of the line patterns L1, L2 of the line and space patterns of the first main scale layer are preferably 0.1 to 10 μm. The widths of the space regions S1, S2 of the line and space patterns of the first main scale layer may be 0.2 to 11 μm. The widths of the second main scale patterns 810a, 810b are preferably 0.1 to 10 μm. The widths of the vernier scale patterns 820a, 820b may be 0.1 to 10 μm.

The lengths of the line and space patterns LS1, LS2 of the first main scale layer are preferably 1 to 50 μm. The lengths of the second main scale patterns 810a, 810b may be equal to those of the line and space patterns LS1, LS2 of the first main scale layer. The lengths of the vernier scale patterns 820a, 820b may be equal to those of the line and space patterns LS1, LS2 of the first main scale layer.

As described above according to the present invention, in the case of measuring overlay using the overlay measurement mark according to the present invention, at least two measurement values and an average value of the measurement values are achieved. Further, even if distorted patterns are partially formed due to procedure problems, values at the distorted patterns are excluded and thus, reliability of overlay measurement values can be increased with the rest of measurement values data. Therefore, semiconductor fabrication processes can be performed using the reliable overlay measurement mark, thereby minimizing an overlay failure ratio in a semiconductor device, and increasing a production yield of semiconductor devices. Furthermore, the overlay measurement mark according to the present invention occupies a relatively small area in comparison with the conventional box-in-box type measurement mark so that area for a scribe line region can be reduced. Therefore, the number of chips produced from one wafer is increased, thereby increasing productivity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
a scribe line region disposed on a semiconductor substrate;
a main scale layer having line and space patterns disposed on the scribe line region; and
vernier scale patterns disposed on space regions of the line and space patterns of the main scale layer, the vernier scale patterns having a line shape and having smaller widths than those of line patterns of the main scale layer, wherein the space regions of the main scale layer are disposed between the line patterns of the main scale layer.

2. The semiconductor device according to claim 1, wherein the line patterns of the line and space patterns of the main scale layer are embossed or recessed patterns.

3. The semiconductor device according to claim 1, wherein the line and space patterns of the main scale layer include vertical patterns and horizontal patterns.

4. The semiconductor device according to claim 1, wherein widths of the space regions of the line and space patterns are equal to or greater than widths of the line patterns of the line and space patterns.

5. The semiconductor device according to claim 4, wherein a width of each of the line patterns of the line and space patterns of the main scale layer is 0.1 to 10 μm.

6. The semiconductor device according to claim 4, wherein a width of each of the space regions of the line and space patterns of the main scale layer is 0.1 to 10 μm.

7. The semiconductor device according to claim 4, wherein a width of each of the vernier scale patterns is 0.05 to 9.5 μm.

8. The semiconductor device according to claim 1, wherein widths of the line patterns of the line and space patterns are greater than widths of the space regions of the line and space patterns.

9. The semiconductor device according to claim 8, wherein a width of each of the line patterns of the line and space patterns of the main scale layer is 1 to 50 μm.

10. The semiconductor device according to claim 8, wherein a width of each of the space regions of the line and space patterns of the main scale layer is 0.3 to 30 μm.

11. The semiconductor device according to claim 8, wherein a width of each of the vernier scale patterns is 0.1 to 10 μm.

12. The semiconductor device according to claim 1, wherein a length of each of the line and space patterns of the main scale layer is 1 to 50 μm.

13. The semiconductor device according to claim 12, wherein lengths of the vernier scale patterns are equal to lengths of the line and space patterns of the main scale layer.

14. The semiconductor device according to claim 1, wherein the line patterns of the line and space patterns of the main scale layer are composed of a plurality of vertical or horizontal fine line and space patterns.

15. The semiconductor device according to claim 1, wherein the line-shaped vernier scale patterns are composed of a plurality of vertical or horizontal fine line and space patterns.

16. The semiconductor device according to claim 1, wherein the line and space patterns of the main scale layer and the vernier scale patterns constitute an overlay measurement mark.

17. The semiconductor device according to claim 16, further comprising a protecting layer ring around the overlay measurement mark to be spaced from the mark with 2 to 10 μm.

18. The semiconductor device according to claim 1, wherein the main scale layer is disposed at a lower layer, and the vernier scale patterns are disposed at a film, the film formed on the lower layer.

19. The semiconductor device according to claim 17, wherein a width of the protecting layer ring is 1 to 10 μm.

20. A semiconductor device comprising:
a scribe line region disposed on a semiconductor substrate;
a first main scale layer having a first group of line and space patterns and a second group of line and space patterns disposed on the scribe line region;
line-shaped second main scale patterns disposed on space regions of the first group of the line and space patterns; and
line-shaped vernier scale patterns disposed on space regions of the second group of the line and space patterns, wherein the space regions of the second group of the line and space patterns are disposed between the line patterns of the second group of the line and space patterns.

21. The semiconductor device according to claim 20, wherein the line patterns of the line and space patterns of the first main scale layer are embossed or recessed patterns.

22. The semiconductor device according to claim 20, wherein the first group and the second group of the line and space patterns of the first main scale layer are composed of vertical patterns and horizontal patterns.

23. The semiconductor device according to claim 20, wherein a width of each of the line patterns of the line and space patterns of the first main scale layer is 0.1 to 10 μm.

24. The semiconductor device according to claim 20, wherein a width of each of the space regions of the line and space patterns of the first main scale layer is 0.2 to 11 μm.

25. The semiconductor device according to claim 20, wherein a width of each of the second main scale patterns is 0.1 to 10 μm.

26. The semiconductor device according to claim 20, wherein a width of each of the vernier scale patterns is 0.1 to 10 μm.

27. The semiconductor device according to claim 20, wherein a length of each of the line and space patterns of the first main scale layer is 1 to 50 μm.

28. The semiconductor device according to claim 27, wherein lengths of the second main scale patterns are equal to lengths of the line and space patterns of the first main scale layer.

29. The semiconductor device according to claim 27, wherein lengths of the vernier scale patterns are equal to lengths of the line and space patterns of the first main scale layer.

30. The semiconductor device according to claim 20, wherein the line and space patterns of the first main scale layer, the second main scale patterns, and the vernier scale patterns constitute an overlay measurement mark.

31. The semiconductor device according to claim 30, further comprising a protecting layer ring around the overlay measurement mark to be spaced from the mark with 2 to 10 μm.

32. The semiconductor device according to claim 31, wherein a width of the protecting layer ring is 1 to 10 µm.

33. The semiconductor device according to claim 20, wherein the first main scale layer is disposed at a lower layer, and the line-shaped vernier scale patterns are disposed at a film, the film formed on the lower layer.

* * * * *

UNITED STATES PATENT AND TRADEMARK OFFICE
CERTIFICATE OF CORRECTION

| | |
|---|---|
| PATENT NO. | : 7,582,899 B2 |
| APPLICATION NO. | : 11/296921 |
| DATED | : September 1, 2009 |
| INVENTOR(S) | : Koh et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 734 days.

Signed and Sealed this

Fourteenth Day of September, 2010

David J. Kappos
*Director of the United States Patent and Trademark Office*